United States Patent
Yalamanchili et al.

(10) Patent No.: US 6,225,683 B1
(45) Date of Patent: May 1, 2001

(54) DIE SIZE-INCREASING INTEGRATED CIRCUIT LEADS AND THERMALLY ENHANCED LEADFRAME

(75) Inventors: Prasad V. V. Yalamanchili, Santa Clara, CA (US); Oliver J. Kierse, County Clare (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/312,142

(22) Filed: May 14, 1999

(51) Int. Cl.[7] .......................... H01L 23/495; H01L 23/45
(52) U.S. Cl. .......................... 257/666; 257/692; 257/696; 257/783
(58) Field of Search .................................. 257/666, 692, 257/696, 783

(56) References Cited

U.S. PATENT DOCUMENTS

| | | | |
|---|---|---|---|
| 5,252,855 | * 10/1993 | Ogawa et al. | 257/676 |
| 5,436,500 | * 7/1995 | Park et al. | 257/696 |
| 5,541,446 | 7/1996 | Kierse | 257/666 |
| 5,963,433 | * 10/1999 | Kim | 361/813 |
| 6,075,283 | * 6/2000 | Kinsman et al. | 257/676 |

FOREIGN PATENT DOCUMENTS 4-91458 * 3/1992 (JP).

* cited by examiner

Primary Examiner—Eddie C. Lee
Assistant Examiner—Jhihan B Clark
(74) Attorney, Agent, or Firm—Koppel & Jacobs

(57) ABSTRACT

A "paddle-under-lead" (PUL) leadframe has the inner portions of an I.C. package's leads extend along the top of a paddle, to which they are affixed. An I.C. die is affixed to the top of the inner leads to form an I.C. package. Because the die is affixed directly to the leads, heat generated by the die is conducted out of the package via the package's leads, with the paddle serving as a heat spreader and heat sink. The leadframe's inner leads are affixed to the paddle, rather than separated from it as is done conventionally; this enables a larger die size to be accommodated within the same standard package size. A bifurcated inner lead design, usable with the PUL leadframe and others, divides the inner portions of an I.C. package's leads into laterally offset upper and lower sections, with the upper section serving as a wedge bond shelf and the lower section downset from the upper section. Each lead's downset and bond shelf occupy parallel spaces, thereby recapturing space that is normally lost to the downset and thereby enabling a larger die size to be accommodated within the same standard package size.

23 Claims, 9 Drawing Sheets

8ld MSOP

| | Thermal Resistance (C/W) | Improvement in Thermal Resistance | Maximum Die Size (mil$^2$) | Increase in Die Size |
|---|---|---|---|---|
| Std. Leadframe | 220 | – | 60 x 86 | – |
| PUL Leadframe w/bifurcated Leads | 153 | 30% | 75 x 90 | 31% |

FIG.5a

16ld TSSOP

| | Thermal Resistance (C/W) | Improvement in Thermal Resistance | Maximum Die Size (mil$^2$) | Increase in Die Size |
|---|---|---|---|---|
| Std. Leadframe | 151 | – | 103 x 103 | – |
| PUL Leadframe w/bifurcated Leads | 101 | 33% | 129 x 167 | 103% |

FIG.5b

DIE SIZE-INCREASING INTEGRATED CIRCUIT LEADS AND THERMALLY ENHANCED LEADFRAME

BACKGROUND OF THE INVENTION

1. Field of the Invention

This invention relates to the field of integrated circuit (I.C.) leadframes, and particularly to leadframes designed to provide improved heat dissipation and/or increased maximum die size.

2. Description of the Related Art

A I.C. package's "leadframe" includes the leads that extend from the package, the structure that supports the I.C. die, and any structures employed to hold these elements together. Many types of leadframes have been developed and are in use, including "lead-under-paddle" (LUP) and "chip-on-lead" (COL) leadframes, for example.

Plan view and corresponding cross-sectional views of a standard 8-lead "mini small outline package" (MSOP) leadframe are shown in FIGS. 1a and 1b, respectively. As used herein, a "standard" package is one for which a set of dimensions has been defined and adopted by the I.C. industry. An I.C. die 10 is on a "paddle" 12, and is secured to the paddle with some type of adhesive 14. The ends of the package's leads 16 which are to be connected to the die are arrayed around, but physically separate from, the paddle 12, and the interconnections between the die and the leads are provided by wire bonds 18. The ends of the leads that will be encapsulated within the package are referred to herein as the "inner" portions of the leads, with the portions that extend out from the package referred to as the "outer" portions.

When operating, an I.C. die generates heat, and many leadframes include features to aid in dissipating the heat produced by the die. For example, in the leadframe of FIG. 1, the paddle 12 is often made of metal, and the adhesive 14 is thermally conductive, so that some of the heat generated by the die is conducted to the paddle. The physically separated paddle 12 and leads 16 are held in a desired proximity to each other with a mold compound 20 (not shown in FIG. 1a for clarity), which forms the exterior of the I.C. package 22. When heat is generated by I.C. die 10, it is conducted to the paddle as noted above, and then to the leads 16 through the mold compound 20. Unfortunately, molding compounds in common use have a very low thermal conductivity. This increases the thermal resistance between the die and the leads, and limits the amount of heat that can be dissipated by the die. The limited heat dissipation capabilities of such a package in turn limit the power that can be consumed by the I.C. die, as well as the uses to which the die can be put. Poor heat dissipation can also accelerate the failure rate of the die's circuitry.

Wire bonds are usually "wedge bonded" to the package leads, typically accomplished by pressing a gold wire bond to a small silver-plated area (the "wedge bond shelf") of a copper lead. However, to provide good anchoring of the package leads, the inner portions which include the bond shelves should extend well into the molding. This reduces the maximum size of the paddle—and consequently the maximum die size—i.e., the die's surface area—that can be accommodated in a given standard package size.

One approach to these problems is found in U.S. Pat. No. 5,541,446 to Kierse. Here, an I.C. die is affixed directly to the package leads, and the paddle is eliminated. This arrangement helps to reduce the package's thermal resistance, but does nothing to address the die size area lost to the bond shelves. Furthermore, with the package encapsulating only the leads and the die, it may be difficult to ensure the coplanarity of the package leads.

SUMMARY OF THE INVENTION

A new "paddle-under-lead" (PUL) leadframe is presented that greatly reduces the adverse impacts of the problems noted above. The PUL leadframe provides much improved heat dissipation, while allowing a larger die size to be accommodated within a standard I.C. package size. A new bifurcated inner lead design is also presented. The bifurcated leads are suitable for use with a variety of leadframe types, including the new PUL leadframe, and further increase allowable die size.

The construction of a PUL leadframe has the inner portions of an I.C. package's leads extended along and affixed to the top of a paddle; each of the inner portions includes a bond shelf. A complete I.C. package is formed by affixing an I.C. die to the top of the inner leads, and interconnecting wire bonds between the die's bonding pads and the leadframe's bond shelves. Because the die is affixed directly to the leads, heat generated by the die is efficiently conducted out of the package via the package's leads. The paddle is preferably metal, and thermally conductive adhesives are preferably used to affix die to leads and leads to paddle. When so configured, the paddle serves as a heat spreader and heat sink and further enhances the package's ability to dissipate heat.

The PUL leadframe increases the size of a die that can be accommodated in a standard package size when compared with prior art leadframes. The leadframe's inner leads are affixed to the paddle, rather than separated from it as is done conventionally. As a result, a larger die size can be accommodated within the same standard package size. Affixing the inner lead sections to the paddle provides good anchoring for the leads, and also serves to avoid coplanarity problems during die attach. The paddle can be made of a conductive material such as copper, and by connecting a wire bond between die and paddle can serve as a ground or power plane for the die.

The invention's novel inner leads bifurcate the inner portions of an I.C. package's leads into upper and lower sections, with the upper section serving as a wedge bond shelf and the lower section downset from the upper section. Conventionally, a downset lead's bond shelf is located in series between the downset and the outside of the package; because both downset and bond shelf must be accommodated within specified package dimensions, the maximum die size is necessarily reduced. The use of the described bifurcated leads avoids this consequence by enabling the downset and the bond shelf to occupy parallel spaces, thereby recapturing the space that is normally lost to the downset. The bifurcated leads can be used with a number of leadframe types, including, for example, the PUL leadframe described herein, LUP leadframes, and COL leadframes.

Further features and advantages of the invention will be apparent to those skilled in the art from the following detailed description, taken together with the accompanying drawings.

BRIEF DESCRIPTION OF THE DRAWINGS

FIGS. 3b and 3c are cross-sectional views (cut along section lines 3b—3b and 3c—3c, respectively), of the leadframe shown in FIG. 3a.

FIG. 5a is a table comparing thermal resistance and maximum die size between a standard 8-lead MSOP leadframe and an 8-lead MSOP PUL leadframe with bifurcated leads per the present invention.

FIG. 5b is a table comparing thermal resistance and maximum die size between a standard 16-lead TSSOP leadframe and a 16-lead TSSOP PUL leadframe with bifurcated leads per the present invention.

FIGS. 7b and 7c are cross-sectional views (cut along section lines 7b—7b and 7c—7c, respectively), of the leadframe shown in FIG. 7a.

FIGS. 8b and 8c are cross-sectional views (cut along section lines 8b—8b and 8c—8c, respectively), of the leadframe shown in FIG. 8a.

DETAILED DESCRIPTION OF THE INVENTION

Figure 1A:
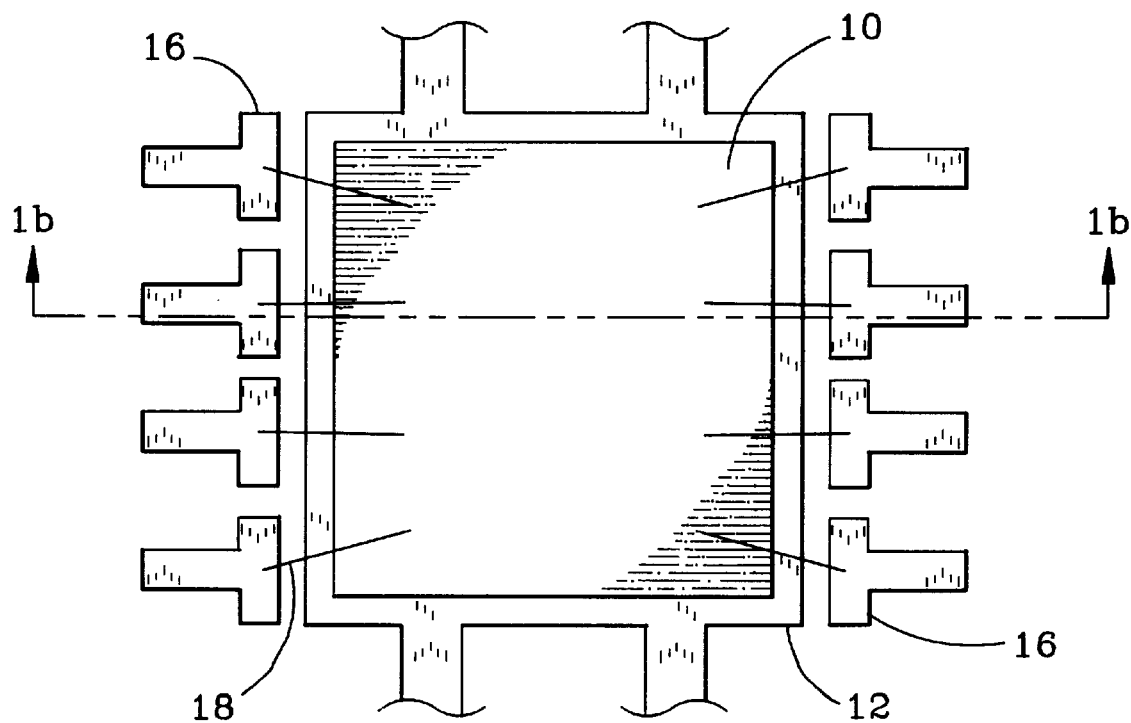
FIGS. 1a and 1b are plan and cross-sectional views (cut along section line 1b—1b), respectively, of a prior art 8-lead MSOP package leadframe.
Figure 1B:
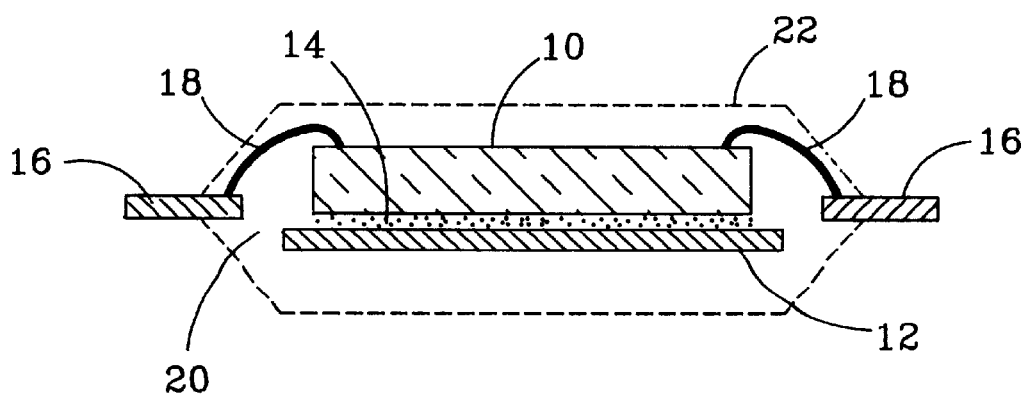
Figure 2A:
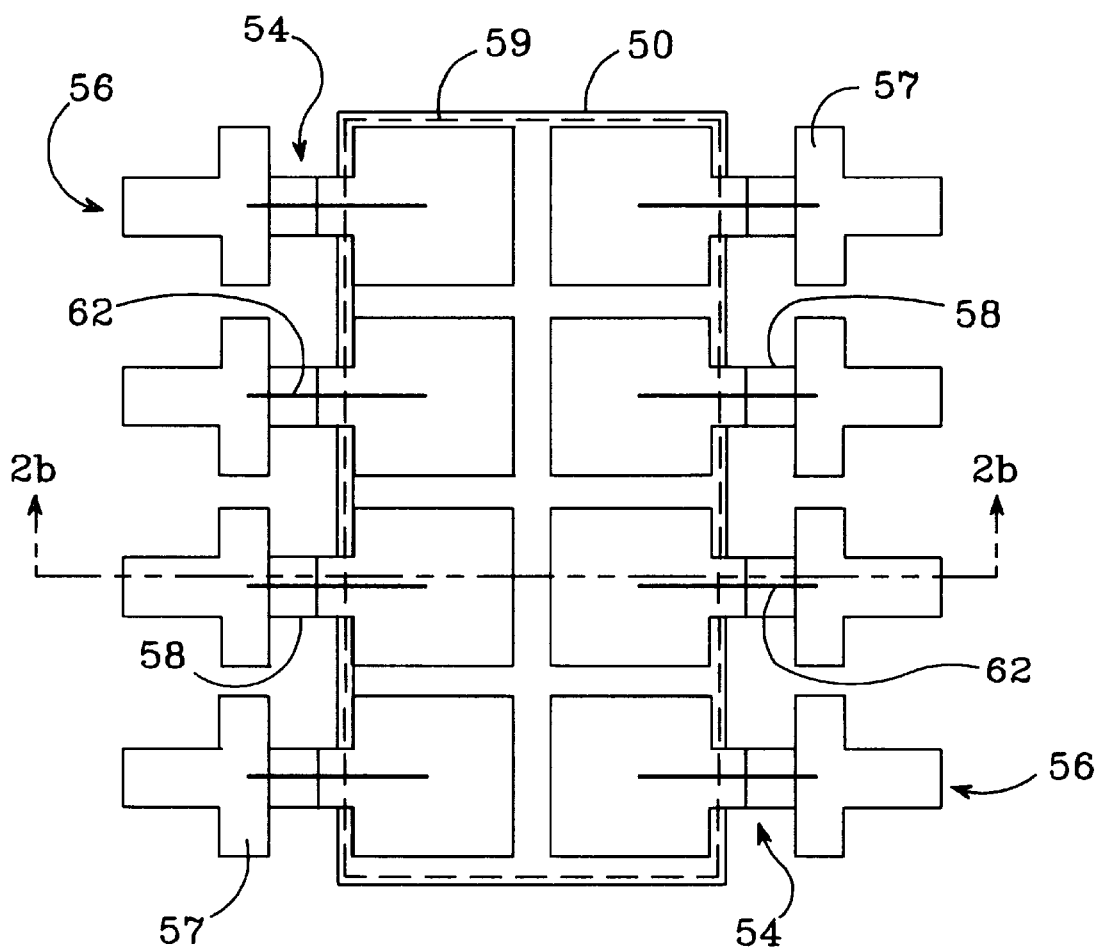
FIGS. 2a and 2b are plan and cross-sectional views (cut along section lines 2b—2b), respectively, of a paddle-under-lead (PUL) leadframe per the present invention.
Figure 2B:
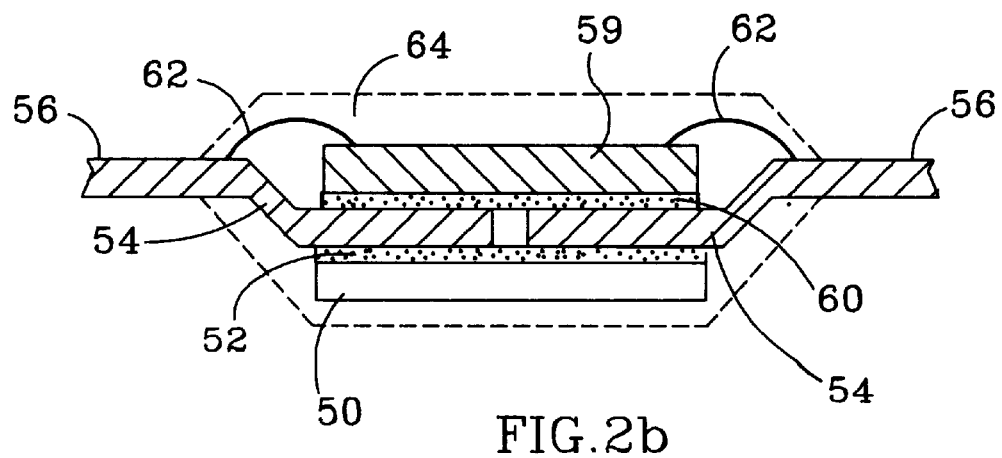

A plan view of a PUL leadframe per the present invention is shown in FIG. 2a, and a corresponding cross-sectional view is shown in FIG. 2b. The PUL leadframe includes a paddle 50 which has a top side and a bottom side. An electrically-isolating adhesive 52 (not shown in FIG. 2a) is applied to the top side, which affixes the undersides of the inner portions 54 of an I.C. package's leads 56 to the top side of paddle 50, forming a leadframe. Because the undersides of the inner portions of the package's leads extend along and are affixed to the top side of the paddle, the leadframe's construction is referred to as "paddle-under-lead" (PUL). Each of the PUL leadframe's inner leads include a wedge bond shelf 57 and a downset portion 58. Note that each of the inner leads in FIG. 2, as well as those shown in FIGS. 3, 4, and 6–8, is made from a single, continuous piece of metal; the perpendicular break lines seen in the plan views of the inner leads indicate a bend in the metal, and not a break.

A complete I.C. package is formed by attaching a die 59 to the leadframe with an electrically-isolating adhesive 60 (not shown in FIG. 2a), which is applied to the top sides of inner lead portions 54 and affixes the die to the leads. The die 59 is connected to the leadframe via wire bonds 62, which run between the die's bond pads and the leadframe's wedge bond shelves. The leadframe is encapsulated within a package 64—typically a molded resin compound. The adhesives 52 and 60 used to adhere the leads to the paddle and the die, respectively, must be electrically-isolating, to prevent the leads from being shorted together.

By sandwiching the package's leads between die 59 and paddle 50, the spacing conventionally found between paddle and leads is eliminated, which enables a larger die size to be accommodated within a given package size. Conventional leadframes that attach a die directly to the paddle specify that the die can only extend to within 4–5 mils of the edge of the paddle, to ensure that the paddle fully supports the die by allowing for the typical die size tolerance of ±6 mils. The construction of the PUL leadframe, on the other hand, is not subject to these limitations. With the die supported by the leads instead of the paddle, the die's size is no longer limited by that of the paddle, eliminating the need to accommodate the die size tolerance of ±6 mils. Thus, maximum die size is increased by about 12 mils over conventional leadframes (6 mils on either side of the die) by virtue of the PUL leadframe construction.

In addition to its die-size-increasing benefits, the PUL leadframe also provides superior thermal performance. Heat generated by I.C. die 58 is conducted via adhesive 60, which is preferably thermally conductive, to the inner portions 54 of the leads. From there, heat is conducted out of the package via the leads, where it is dissipated into the ambient air and into the printed circuit board (PCB) to which the leads are connected. Some of the generated heat will be conducted by the leads to paddle 50 via adhesive 52, which is also preferably thermally conductive; if the paddle is made from a thermally conductive material, additional heat is dissipated by this route. With leads 54 in close contact with die 58, rather than separated from the die by the mold compound of the prior art, the thermal resistance of the PUL leadframe is significantly reduced.

Figure 3A:
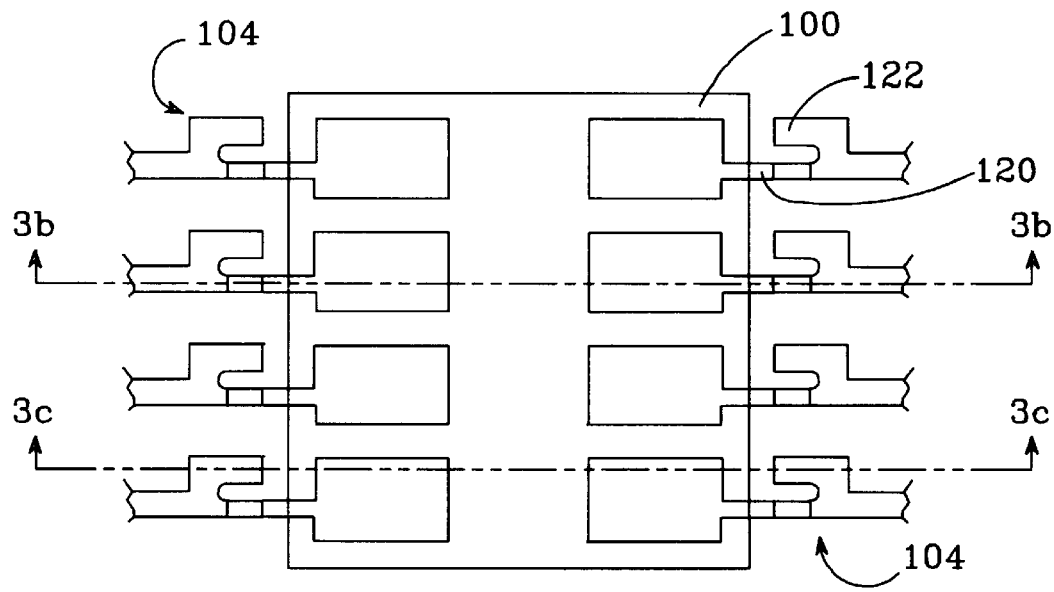
FIG. 3a is a plan view of a PUL leadframe with bifurcated leads per the present invention.
Figure 3B:
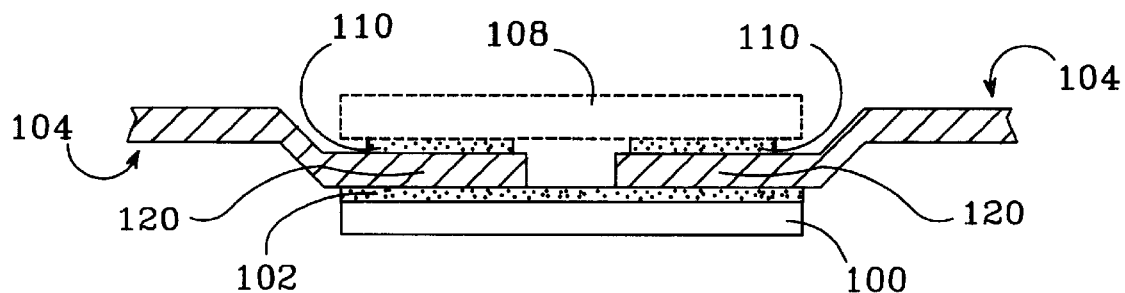
Figure 3C:
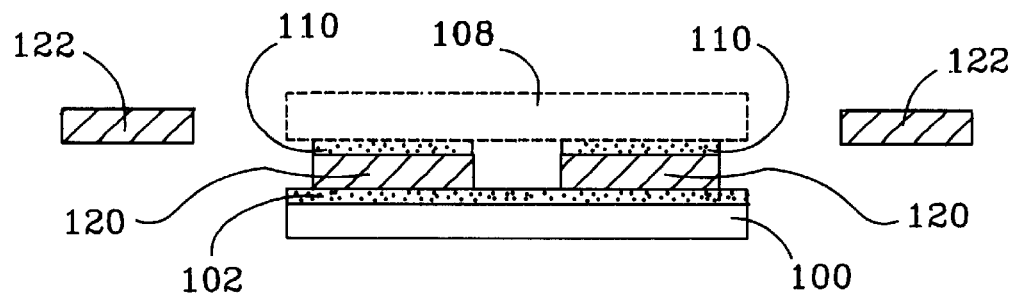

A bifurcated inner lead design is illustrated in FIGS. 3a–3c, which provide a plan view (FIG. 3a) and corresponding cross-sectional views (FIGS. 3b and 3c) of such leads as they might be employed as part of a PUL leadframe. As above, the PUL leadframe includes a paddle 100 which has a top side and a bottom side. An electrically-isolating adhesive 102 (not shown in FIG. 3a) is applied to the top side, which affixes the undersides of the inner portions 104 of an I.C. package's leads to the top side of paddle 100, forming a PUL leadframe. A die 108 (not shown in FIG. 3a) is attached to the leadframe with an electrically-isolating adhesive 110, which is applied to the top sides of inner lead portions 104 and affixes the die to the leads.

The inner lead portions 104 are bifurcated into a lower section 120 and an upper section 122. Each lead splits as it approaches paddle 100, with "lower" section 120 downset towards the paddle, and upper section 122 remaining about level or bending slightly upward, so that it extends above and about parallel to the lower section. The upper lead section 122 provides a bond shelf, to which a wire bond can be wedge-bonded. Though parallel, the upper and lower lead sections are preferably offset laterally, which enables the bifurcated lead to be made from a single, continuous metal layer.

Figure 4A:
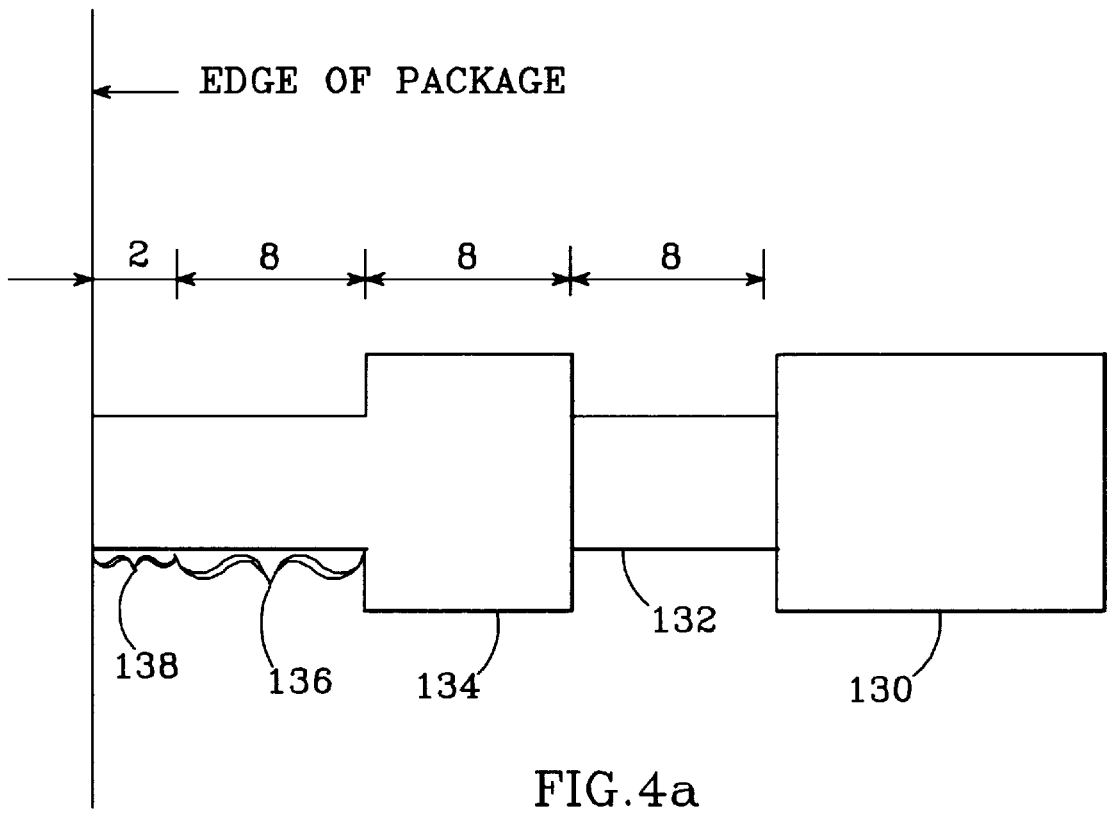
FIG. 4a is a plan view of a single lead that might be used with a PUL leadframe per the present invention, illustrating the dimensions of several portions of the lead.
Figure 4B:
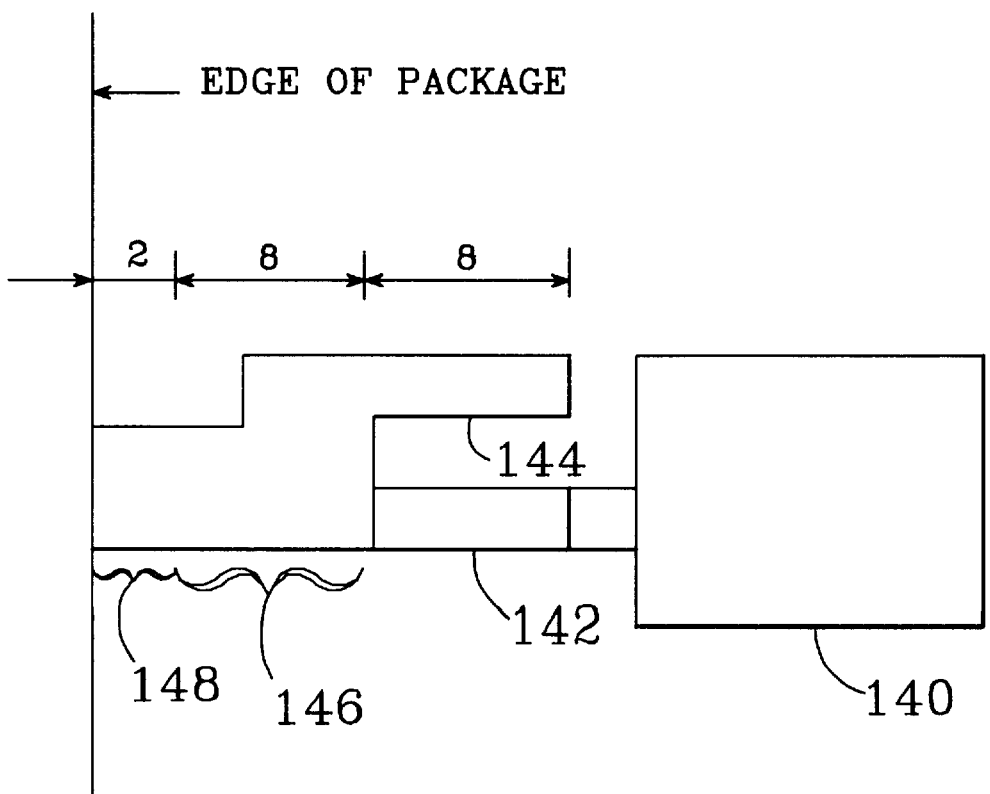
FIG. 4b is a plan view of a bifurcated lead that might be used with a PUL leadframe, illustrating the dimensions of several portions of the lead.

The described bifurcated lead enables the PUL leadframe to accommodate a larger die size than is possible with non-bifurcated leads. This is illustrated in FIGS. 4a and 4b, which contrast a non-bifurcated lead (FIG. 4a) such as those shown in FIGS. 2a and 2b with a bifurcated lead (FIG. 4b). The non-bifurcated lead includes a portion 130 to provide proper anchoring, a downset portion 132 and a wedge bond shelf portion 134 both typically about 8 mils. The wedge bond shelf is typically silver plated, and a chemical bond is formed when a gold bond wire is pressed to the silver plating. A length of about 8 mils provides a silver plating tolerance zone 136, and because the silver plating should not be exposed to the outside of the package, an additional 2 mil tolerance zone 138 is used to allow for any package to leadframe mismatch.

A bifurcated lead per the present invention is shown in FIG. 4b. The lead again includes a portion 140 to provide proper anchoring, and a downset portion 142 and a wedge bond shelf 144. As before, both the downset portion and the wedge bond shelf are about 8 mils long (as measured across the width of the package). Here, however, the downset portion and the wedge bond shelf are arranged in parallel, rather than in series as in FIG. 4a. An 8 mil silver plating tolerance zone 146 and a 2 mil zone 148 to allow for package to leadframe mismatch are unchanged.

Because the bifurcated inner lead portion permits the downset portion 142 and the wedge bond shelf 144 to be in parallel, a space savings of 8 mils is realized. This savings is also realized on the opposite side of the chip, for a total space savings of 16 mils. Thus, the maximum die size that can be accommodated with the use of the described bifurcated leads is increased by about 16 mils across the width of the package over that provided by previous leadframes.

Even when using the more conventional lead design of FIGS. 2a and 2b, the PUL leadframe described herein provides an increase in die size by recapturing space that is otherwise lost to the separation between leads and paddle. Preferably, however, the PUL leadframe also employs the described bifurcated leads, to provide an even greater improvement in maximum die size. Tables are presented in FIGS. 5a and 5b which summarize the improvements in die size and thermal resistance provided by 8-lead MSOP and 16-lead TSSOP PUL leadframes employing bifurcated leads, respectively, and compares these characteristics with those of their conventional counterparts. As can be seen from the tables, the improved leadframe reduces thermal resistance by at least 30%, and increases the maximum die size by about 31% for an 8-lead MSOP, and by about 103% for a 16-pin TSSOP.

It is extremely advantageous that the invention provides both improved heat dissipation (due to the PUL leadframe construction) and increased maximum die size (due to the PUL leadframe and the bifurcated leads). A larger die is likely to generate more heat than one that is smaller. Fortunately, the PUL leadframe's improved heat dissipation enables the additional heat to be safely conducted away from the die, so that the invention's larger die size benefits can be fully realized.

As noted above, adhesives 102 and 110 are required to be electrically-isolating to avoid shorting the leadframe's leads together. These adhesives are also preferably thermally conductive, to aid in the dissipation of heat from die 108 to paddle 100 and to the outside of the I.C. package. Paddle 100 is also preferably thermally conductive—also to improve the leadframe's thermal performance.

The use of a PUL leadframe in an 8-lead MSOP package is merely exemplary; the invention provides heat dissipation and space-saving advantages in any number of package types. For example, the PUL leadframe is adaptable to I.C. packages having leads extending from two sides, such as SOIC, TSOP, TSSOP, PDIP and SSOP packages, as well as to quad-sided packages, such as the PLCC and QFP types.

Figure 6A:
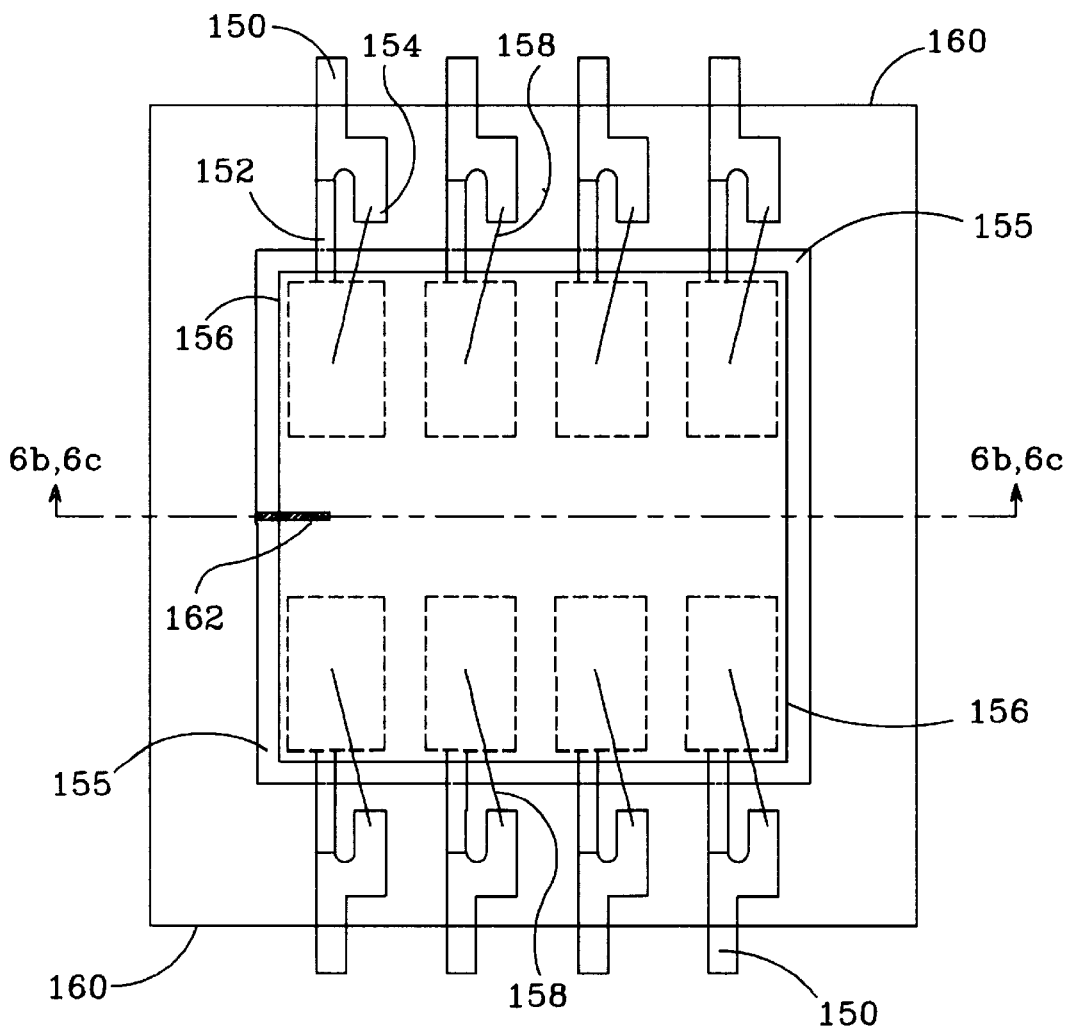
FIGS. 6a and 6b are plan and cross-sectional views (cut along section line 6b—6b), respectively, of an I.C. package including an 8-lead MSOP PUL leadframe with bifurcated leads per the present invention, and illustrating the use of the leadframe's paddle as a ground or power plane.
Figure 6B:
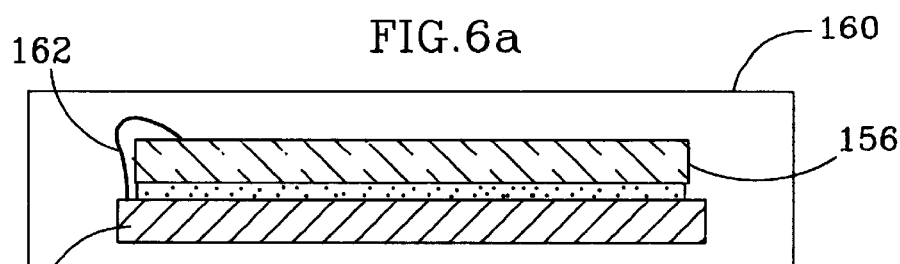

An I.C. package built around a PUL leadframe employing bifurcated leads is shown in FIG. 6a, with a corresponding cross-section shown in FIG. 6b (die, paddle and inner lead portions not shown as hidden for clarity). As in FIGS. 3a–3c, the leadframe includes bifurcated leads 150 having parallel downset (152) and wedge bond (154) portions, affixed to the top of a paddle 155. A die 156 is affixed to the top sides of the inner lead portions. The die is connected to the leadframe via wire bonds 158, which run between the die's bond pads and the leadframe's wedge bond shelves. The leadframe is encapsulated within a package 160—typically a molded resin compound.

Paddle 155 can be used as a ground or power plane for the I.C. To accomplish this, a wire bond 162 is connected from one or more bond pads on die 156 to paddle 155. If paddle 155 is made from an electrically conductive material such as copper, wire bond 162 brings the paddle up to the voltage of the pad to which it is connected. Both the package leads 150 and the paddle 155 are preferably copper, because of copper's good electrical and thermal conductivity.

Figure 6C:
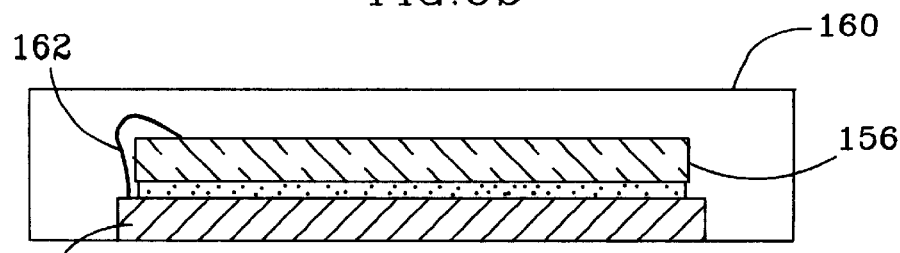
FIG. 6c is a cross-sectional view (cut along section line 6c—6c) of the I.C. package of FIG. 6a, illustrating an alternative embodiment of an I.C. package per the present invention in which the paddle is exposed at the bottom of the package.

Another embodiment of an I.C. package per the present invention is shown in FIG. 6c, which is an alternative cross-sectional view of the package of FIG. 6a, cut along section line 6c—6c. Here, at least a portion of paddle 155 is not encapsulated within package 160. Instead, a portion of the paddle is exposed to the ambient air at the bottom of the package 160, to provide additional heat dissipation. This is accomplished by downsetting the leads to the degree necessary to push the bottom of the paddle down until it is at least flush with the bottom of the package, or by making the paddle thick enough to have the same effect.

A problem frequently encountered in the field of leadframe design is that of the coplanarity of the package's leads; i.e., the inner portions of an I.C. package's leads should all lie in the same plane. If coplanarity cannot be maintained, the leadframe could electrically short the die. The PUL leadframe avoids this problem by affixing the package leads directly to the flat paddle, ensuring their coplanarity. However, while a paddle is essential to the PUL leadframe, it is not essential that a copper paddle be used. Other materials—a polyimide tape such as Elephane R-722 or R-970 from Tomoegawa Paper Company Limited, Japan, can be employed when electrical conductivity and/or good thermal performance are not critical.

The bifurcated leads described herein are not limited to use with a PUL leadframe. Rather, this lead design is generally applicable to leadframe types which require downset inner leads. Two examples are shown in FIGS. 7 and 8, which depict "lead-under-paddle" (LUP) and "chip-on-lead" (COL) leadframes using bifurcated leads.

Figure 7A:
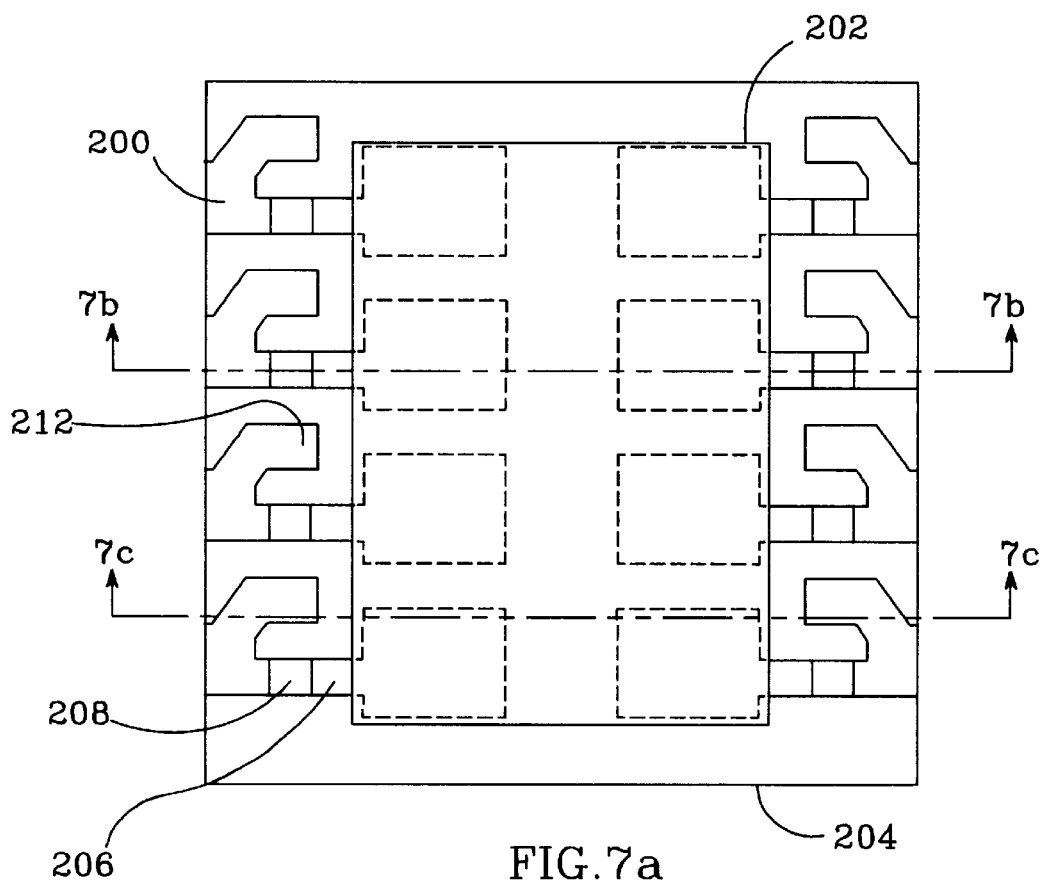
FIG. 7a is a plan view of a LUP leadframe with bifurcated leads per the present invention.

FIG. 7a is a plan view of an I.C. package formed around an LUP leadframe (I.C. die and exterior lead portions not shown for clarity). The package's bifurcated leads 200 extend along and are affixed to the bottom side of a paddle 202 to form an LUP leadframe, which is encapsulated in a package 204.

Figure 7B:
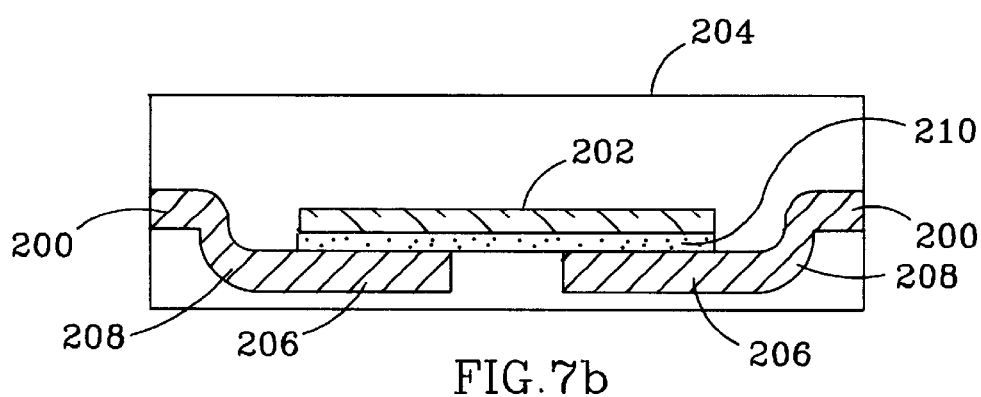
Figure 7C:
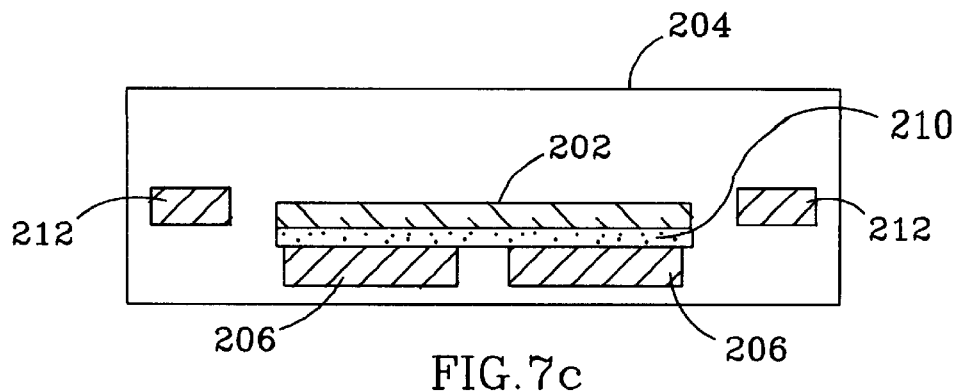

Cross-sectional views of the LUP leadframe are shown in FIGS. 7b and 7c (cut along section lines 7b—7b and 7c—7c, respectively). FIG. 7b shows the lower portions 206 and downset portions 208 of bifurcated leads 200, which are attached to paddle 202 with an adhesive 210 which is electrically-isolating and preferably thermally conductive.

FIG. 7c shows the lower portions 206 and wedge bond shelves 212 of leads 200.

Figure 8A:
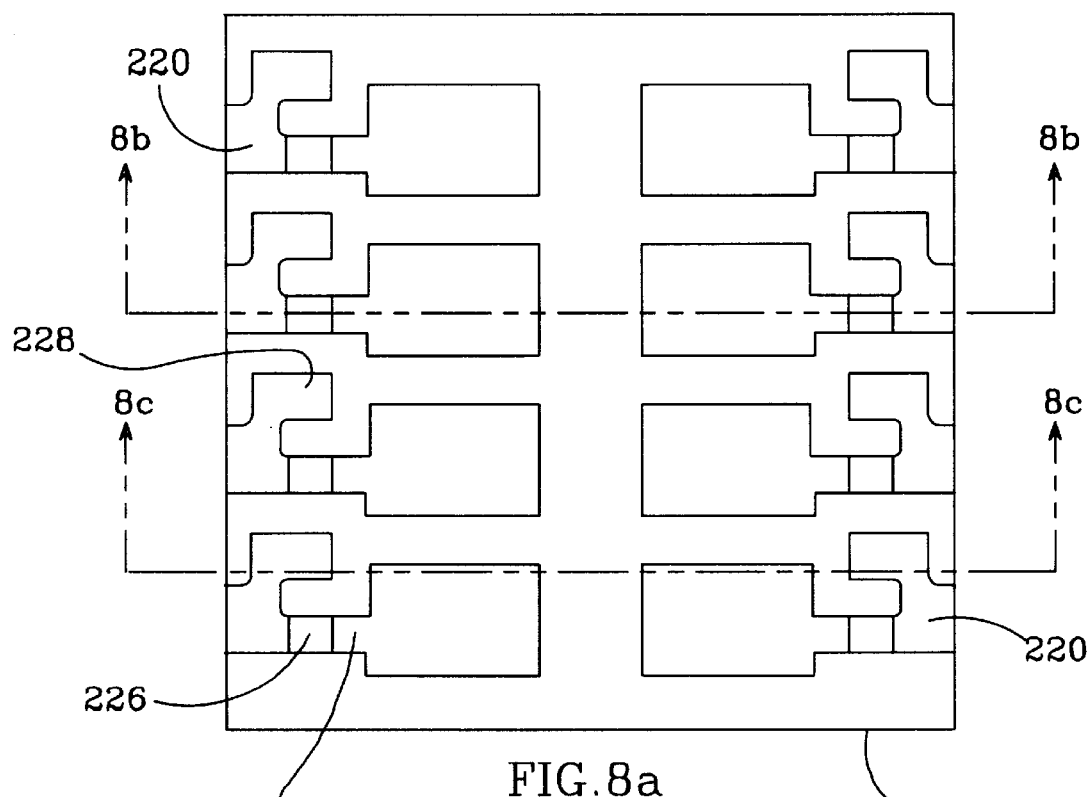
FIG. 8a is a plan view of a COL leadframe with bifurcated leads per the present invention.

FIG. 8a is a plan view of an I.C. package formed around a COL leadframe (I.C. die and exterior lead portions not shown for clarity). The package's bifurcated leads 220 are encapsulated in a package 222 to form a COL leadframe.

Figure 8B:
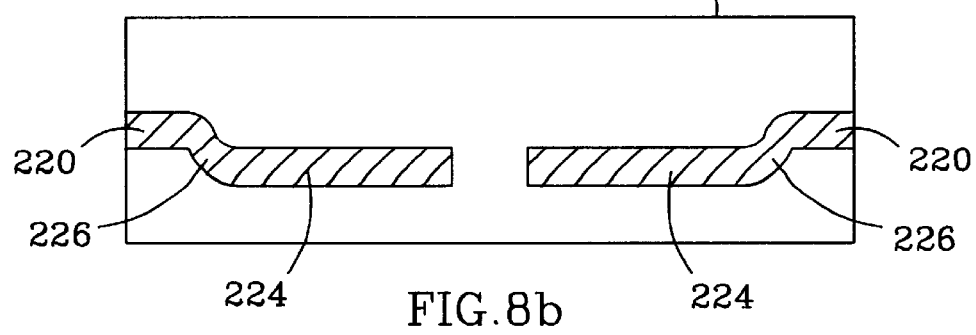
Figure 8C:
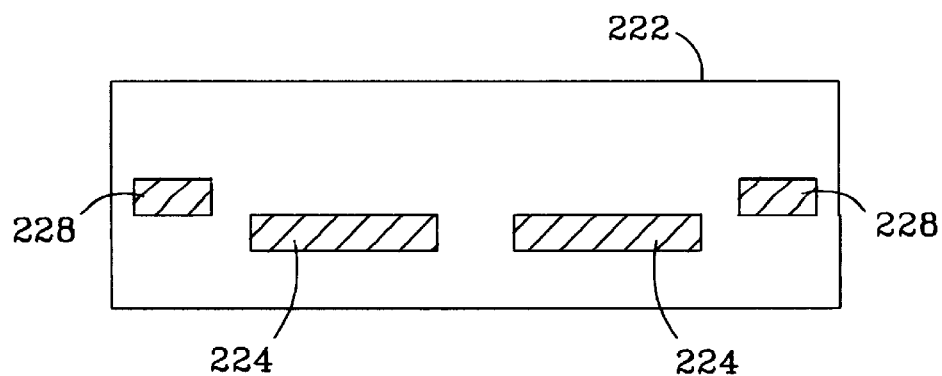

Cross-sectional views of the COL leadframe are shown in FIGS. 8b and 8c (cut along section lines 8b—8b and 8c—8c, respectively). FIG. 8b shows the lower portions 224 and downset portions 226 of bifurcated leads 220. FIG. 8c shows the lower portions 224 and wedge bond shelves 228 of leads 220.

Figure 8D:
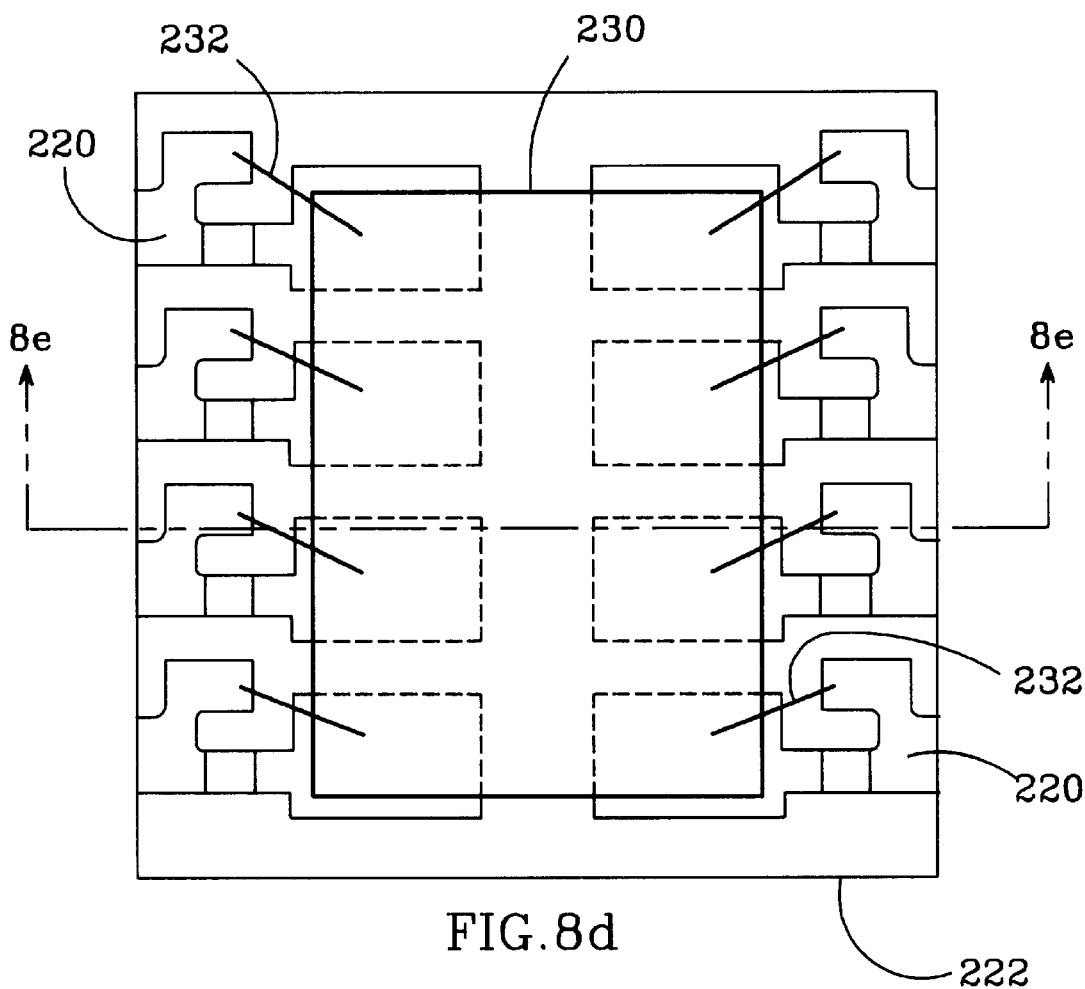
FIGS. 8d and 8e are plan and cross-sectional views (cut along section line 8e—8e), respectively, of an I.C. package including a COL leadframe with bifurcated leads per the present invention.
Figure 8E:
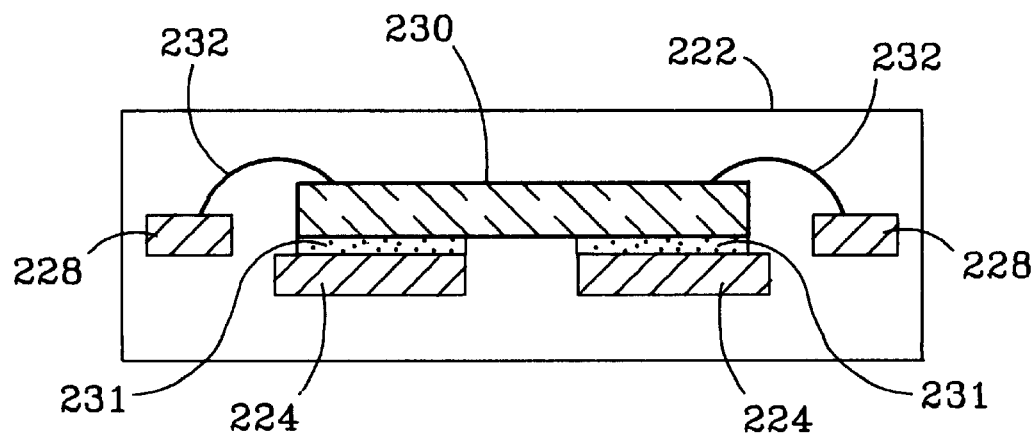

A die 230 is attached to the COL leadframe of FIGS. 8a–8c in FIGS. 8d (plan view) and 8e (corresponding cross-sectional view). Die 230 is affixed to the leadframe's inner lead portions 224 with an adhesive 231. The die 230 is connected to wedge bond shelves 228 with wire bonds 232 to form a complete I.C. package.

As noted above, bifurcated leads per the present invention are not limited to use with the PUL, LUP and COL leadframes depicted in FIGS. 3, 7 and 8, respectively. Any leadframe that requires downset leads can realize a die size increase, because the bifurcated leads enable the downset and the wedge bond shelves to occupy parallel spaces, thereby recapturing the space that is normally lost to the downset.

While particular embodiments of the invention have been shown and described, numerous variations and alternate embodiments will occur to those skilled in the art. Accordingly, it is intended that the invention be limited only in terms of the appended claims.

We claim:

1. A thermally enhanced paddle-under-lead (PUL) integrated circuit (I.C.) leadframe, comprising:
   a paddle having top and bottom sides, said top side of said paddle being suitable for attaching a plurality of coplanar I.C. package leads,
   a first electrically-isolating adhesive on said top side of said paddle for attaching said paddle to a plurality of I.C. package leads, and
   a plurality of I.C. package leads, each of said leads having an outer portion which extends outside of an I.C. package and an inner portion, each of said inner portions downset and extending along and adhered to said top side of said paddle with said first adhesive forming a PUL leadframe,
   said leads arrayed to support an I.C. die on the top sides of said inner portions such that heat generated by said die is conducted from said die to said outer portions via said leads, said PUL leadframe construction thereby lowering the thermal resistance between said I.C. die and the exterior of an I.C. package in comparison with leadframes having leads which are not in close contact with said die.

2. The leadframe of claim 1, wherein said paddle and said first adhesive are thermally conductive.

3. The leadframe of claim 1, wherein said paddle is copper.

4. A thermally enhanced paddle-under-lead (PUL) integrated circuit (I.C.) leadframe, comprising:
   a paddle having top and bottom sides, said top side of said paddle being suitable for attaching a plurality of coplanar I.C. package leads,
   a first electrically-isolating adhesive on said top side of said paddle for attaching said paddle to a plurality of I.C. package leads, and
   a plurality of I.C. package leads, each of said leads having an outer portion which extends outside of an I.C. package and an inner portion, each of said inner portions extending along and adhered to said top side of said paddle with said first adhesive forming a PUL leadframe,
   a second thermally conductive and electrically-isolating adhesive applied to the top sides of said inner portions for adhering an I.C. die,
   said leads arrayed to support an I.C. die on the top sides of said inner portions such that heat generated by said die is conducted from said die to said outer portions via said leads, said PUL leadframe construction thereby lowering the thermal resistance between said I.C. di e and the exterior of an I.C. package in comparison with leadframes having leads which are not in close contact with said die.

5. The leadframe of claim 4, further comprising an I.C. die adhered to the top sides of said inner portions with said second adhesive.

6. The leadframe of claim 5, wherein each of said inner lead portions includes a respective bond shelf portion, further comprising a plurality of wire bonds interconnecting bond pads on the side of said die opposite said leads to respective bond shelves.

7. The leadframe of claim 6, wherein said wire bonds are wedge bonded to said respective bond shelves.

8. The leadframe of claim 7, further comprising an encapsulating material surrounding said leadframe, said outer lead portions extending outside of said encapsulating material, said leadframe, said die, said wire bonds and said encapsulating material forming an I.C. package.

9. The leadframe of claim 8, wherein said I.C. package is arranged to conform to the mini small outline package (MSOP) standard.

10. The leadframe of claim 8, wherein said I.C. package is arranged to conform to the thin shrink small outline package (TSSOP) standard.

11. A thermally enhanced paddle-under-lead (PUL) integrated circuit (I.C.) leadframe, comprising:
   a paddle having top and bottom sides, said top side of said paddle being suitable for attaching a plurality of coplanar I.C. package leads, said paddle comprising polyimide tape,
   a first electrically-isolating adhesive on said top side of said paddle for attaching said paddle to a plurality of I.C. package leads, and
   a plurality of I.C. package leads, each of said leads having an outer portion which extends outside of an I.C. package and an inner portion, each of said inner portions extending along and adhered to said top side of said paddle with said first adhesive forming a PUL leadframe,
   said leads arrayed to support an I.C. die on the top sides of said inner portions such that heat generated by said die is conducted from said die to said outer portions via said leads, said PUL leadframe construction thereby lowering the thermal resistance between said I.C. die and the exterior of an I.C. package in comparison with leadframes having leads which are not in close contact with said die.

12. The leadframe of claim 1, wherein said plurality of leads are copper.

13. A bifurcated lead suitable for use as part of an integrated circuit (I.C.) leadframe, said lead comprising:
   an outer portion suitable for extending outside of an I.C. package, and an inner portion suitable for encapsulating within an I.C. package, said inner portion bifurcated into upper and lower sections, said lower section downset from said upper section, said upper section extending above and about parallel to said lower section to form a bond shelf, said bond shelf and the downset portion of said lower section occupying parallel spaces, thereby enabling a leadframe employing an array of said bifurcated leads to accommodate a larger maximum die size than leadframes having leads with downset and bond shelf portions arranged in series.

14. The bifurcated lead of claim 13, wherein said inner lead portion is made from a single, continuous layer of metal and said upper section is laterally offset from said lower section.

15. The bifurcated lead of claim 13, further comprising a paddle, the inner portions of an array of said bifurcated leads extending along and affixed to said paddle forming a leadframe.

16. The bifurcated lead of claim 13, further comprising an I.C. die, the inner portions of an array of said bifurcated leads extending along and affixed to said die forming a leadframe.

17. A thermally enhanced paddle-under-lead (PUL) integrated circuit (I.C.) leadframe, comprising:

a paddle having top and bottom sides, said top side of said paddle being suitable for attaching a plurality of coplanar I.C. package leads, a first thermally conductive and electrically-isolating adhesive on said top side of said paddle for attaching said paddle to a plurality of I.C. package leads, and a plurality of I.C. package leads, each of said leads having an outer portion which extends outside of an I.C. package and an inner portion, each of said inner portions bifurcated into laterally offset upper and lower sections, the underside of each of said lower sections extending along and adhered to said top side of said paddle with said first adhesive forming a PUL leadframe, said upper sections extending above and about parallel to said lower sections to form respective bond shelves, said leads arrayed to support an I.C. die on the top sides of said lower sections such that heat generated by said die is conducted from said die to said outer portions via said leads, said PUL leadframe construction thereby lowering the thermal resistance between said I.C. die and the exterior of an I.C. package in comparison with I.C. package leadframes having leads which are not in close contact with said die.

18. An thermally enhanced integrated circuit (I.C.) package having a paddle-under-lead (PUL) leadframe, comprising:

an I.C. die, a thermally conductive planar paddle having top and bottom sides, a first thermally conductive and electrically-isolating adhesive on said top side of said paddle for attaching said paddle to a plurality of I.C. package leads, a plurality of coplanar I.C. package leads, each of said leads having an outer portion which extends outside of an I.C. package and an inner portion, each of said inner portions bifurcated into laterally offset upper and lower sections, said lower sections downset with their undersides extending along and adhered to said top side of said paddle with said first adhesive forming a PUL leadframe, said upper sections extending above and about parallel to said lower sections to form respective bond shelves, a second thermally conductive and electrically insulating adhesive applied to the top sides of said lower sections, said I.C. die adhered to the top sides of said lower sections with said second adhesive such that heat generated by said die is conducted from said die to said outer portions via said leads, a plurality of wire bonds interconnecting bond pads on the side of said die opposite said leads to respective bond shelves, and an enclosure encapsulating said PUL leadframe except for the outer portions of said plurality of leads, said outer portions of said leads extending out from said enclosure, the close contact between said die and said leads lowering the thermal resistance between said die and the exterior of said I.C. package when compared with I.C. package leadframes having leads which are not in close contact with said die, said PUL leadframe construction increasing the maximum surface area of said I.C. die that can be accommodated in said I.C. package in comparison with leadframes for I.C. packages of the same size having no leads in close contact with said die or which use leads which are not bifurcated per said plurality of coplanar I.C. package leads.

19. The I.C. package of claim 18, wherein a portion of said paddle is not encapsulated within said enclosure, said exposed portion of said paddle aiding in the dissipation of heat conducted to said paddle via said leads.

20. A thermally enhanced lead-under-paddle (LUP) integrated circuit (I.C.) leadframe, comprising:

a paddle having top and bottom sides, said bottom side of said paddle being suitable for attaching a plurality of coplanar I.C. package leads, a first thermally conductive and electrically-isolating adhesive on said bottom side of said paddle for attaching said paddle to a plurality of I.C. package leads, and a plurality of I.C. package leads, each of said leads having an outer portion which extends outside of an I.C. package and an inner portion, each of said inner portions bifurcated into laterally offset upper and lower sections, the top side of each of said lower sections extending along and adhered to said bottom side of said paddle with said first adhesive forming a LUP leadframe, said upper sections extending above and about parallel to said lower sections to form respective bond shelves, said paddle suitable for supporting an I.C. die on its top side such that heat generated by said die is conducted from said die to said outer portions via said paddle and leads, said LUP leadframe construction thereby lowering the thermal resistance between said I.C. die and the exterior of an I.C. package in comparison with I.C. package leadframes having leads which are not in close contact with said paddle.

21. An thermally enhanced integrated circuit (I.C.) package having a lead-under-paddle (LUP) leadframe, comprising:

an I.C. die, a thermally conductive planar paddle having top and bottom sides, a first thermally conductive and electrically-isolating adhesive on said bottom side of said paddle for attaching said paddle to a plurality of I.C. package leads, a plurality of coplanar I.C. package leads, each of said leads having an outer portion which extends outside of an I.C. package and an inner portion, each of said inner portions bifurcated into laterally offset upper and lower sections, said lower sections downset with their top sides extending along and adhered to said bottom side of said paddle with said first adhesive forming a LUP leadframe, said upper sections extending above and about parallel to said lower sections to form respective bond shelves, a second thermally conductive and electrically insulating adhesive applied to the top side of said paddle, said I.C. die adhered to the top side of said paddle with said second adhesive such that heat generated by said die is conducted from said die to said outer portions via said paddle, a plurality of wire bonds interconnecting bond pads on the side of said die opposite said leads to respective bond shelves, and an enclosure encapsulating said LUP leadframe except for the outer portions of said plurality of leads, said outer portions of said leads extending out from said enclosure, the close contact between said paddle and said leads lowering the thermal resistance between said die and the exterior of said I.C. package in comparison with I.C. package leadframes having leads which are not in close contact with said paddle, said LUP leadframe construction increasing the maximum surface area of said I.C. die that can be accommodated in said I.C. package in comparison with leadframes for I.C. packages of the same size having no leads in close contact with said paddle or which use leads which are not bifurcated per said plurality of coplanar I.C. package leads.

22. An thermally enhanced integrated circuit (I.C.) package having a chip-on-lead (COL) leadframe, comprising:

an I.C. die, a first thermally conductive and electrically-isolating adhesive on said bottom side of said die for attaching said die to a plurality of I.C. package leads, a plurality of I.C. package leads, each of said leads having an outer portion which extends outside of an I.C. package and an inner portion, each of said inner portions bifurcated into laterally offset upper and lower sections, said lower sections downset with their top sides extending along and adhered to said bottom side of said die with said first adhesive forming a COL leadframe, said upper sections extending above and about parallel to said lower sections to form respective bond shelves, a plurality of wire bonds interconnecting bond pads on the side of said die opposite said leads to respective bond shelves, and an enclosure encapsulating said COL leadframe except for the outer portions of said plurality of leads, said outer portions of said leads extending out from said enclosure, the close contact between said die and said leads lowering the thermal resistance between said die and the exterior of said I.C. package in comparison with I.C. package leadframes having leads which are not in close contact with said die, said COL leadframe construction increasing the maximum surface area of said I.C. die that can be accommodated in said I.C. package in comparison with leadframes for I.C. packages of the same size having no leads in close contact with said die or which use leads which are not bifurcated per said plurality of coplanar I.C. package leads.

23. An 8-lead mini small outline integrated circuit (I.C.) package (MSOP) including a thermally enhanced paddle-under-lead (PUL) leadframe, comprising:

an I.C. die, a thermally conductive planar paddle having top and bottom sides, a first thermally conductive and electrically-isolating adhesive on said top side of said paddle for attaching said paddle to a plurality of I.C. package leads, eight I.C. package leads, each of said leads having an outer portion which extends outside of an I.C. package and an inner portion, each of said inner portions bifurcated into laterally offset upper and lower sections, said lower sections downset with their undersides extending along and adhered to said top side of said paddle with said first adhesive forming a PUL leadframe, said upper sections extending above and about parallel to said lower sections to form respective bond shelves, a second thermally conductive and electrically insulating adhesive applied to the top sides of said lower sections, said I.C. die adhered to the top sides of said lower sections with said second adhesive such that heat generated by said die is conducted from said die to said outer portions via said leads, a plurality of wire bonds interconnecting bond pads on the side of said die opposite said leads to respective bond shelves, and an enclosure encapsulating said PUL leadframe except for the outer portions of said plurality of leads, said enclosure arranged to conform to the 8-lead MSOP standard, said outer portions of said leads extending out from said enclosure, the close contact between said die and said leads lowering the thermal resistance between said die and the exterior of said I.C. package in comparison with I.C. package leadframes having leads which are not in close contact with said die, said PUL leadframe providing a thermal resistance between said die and said plurality of leads of less than about 154° C./watt, said PUL leadframe construction increasing the maximum surface area of a die that can be accommodated in said 8-lead MSOP in comparison with leadframes for 8-lead MSOPs having no leads in close contact with said die or which use leads which are not bifurcated per said plurality of coplanar I.C. package leads, said PUL leadframe enabling said 8-lead MSOP to accommodate a die having a surface area of at least $75 \times 90$ mils$^2$.

* * * * *